United States Patent [19]
Wieschhoff et al.

[11] Patent Number: 4,792,766
[45] Date of Patent: Dec. 20, 1988

[54] METHOD OF CONTROLLING TEMPERATURE IN PUSH-PULL AUDIO OUTPUT CIRCUITS AND TEMPERATURE CONTROL CIRCUIT

[75] Inventors: Reinhard Wieschhoff, Hildesheim; Andreas Rinne, Westfeld; Hubertus Pagany, Hildesheim, all of Fed. Rep. of Germany

[73] Assignee: Blaupunkt-Werke GmbH, Hildesheim, Fed. Rep. of Germany

[21] Appl. No.: 64,086

[22] Filed: Jun. 18, 1987

[30] Foreign Application Priority Data

Jul. 5, 1986 [DE] Fed. Rep. of Germany ....... 3622713

[51] Int. Cl.[4] .............................................. H03F 1/52
[52] U.S. Cl. .................................... 330/298; 330/146; 330/207 P
[58] Field of Search ...................... 330/51, 146, 124 R, 330/207 P, 266, 272, 295, 298; 361/103, 106; 455/217, 341, 345

[56] References Cited
U.S. PATENT DOCUMENTS 4,611,180 9/1986 Stanley ........................... 380/146 X Primary Examiner—James B. Mullins
Attorney, Agent, or Firm—Frishauf, Holtz, Goodman & Woodward

[57] ABSTRACT

To permit cooling of transistor push-pull bridge-type audio end stages in car radios, where heat dissipation and cooling of components is difficult to achieve, without entire interruption of signals being amplified, the temperature of a heat sink (HS) is being sensed by a temperature sensor (14), and, if a predetermined level is exceeded as determined, for example, by a threshold circuit (15), one of the bridge arms formed by a transistor (10) is controlled to become saturated, thereby grounding-out the applied signal, so that a loudspeaker (6) will operate at only half voltage and hence ¼ power, to thereby permit cooling of components, while providing some reproduction of introduced audio signals from an audio input terminal (11).

15 Claims, 1 Drawing Sheet

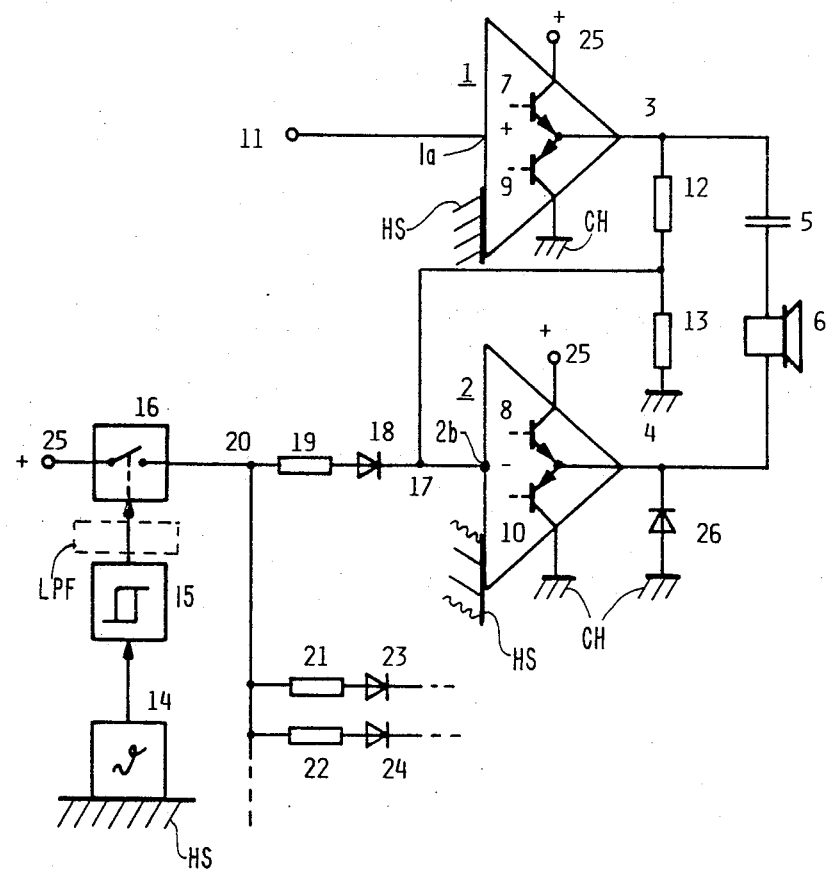

METHOD OF CONTROLLING TEMPERATURE IN PUSH-PULL AUDIO OUTPUT CIRCUITS AND TEMPERATURE CONTROL CIRCUIT

The present invention relates to radio receivers and more particularly to the audio output stage of vehicular type radios, for example, car radios.

BACKGROUND

Problems arise when radio receivers, typically car radios, are installed in a confined region where ventilation is difficult or impossible; in car radios, especially, the limited space availability, and thus small size of the receiver and the maximum housing temperature limit the tolerance to heating, and inhibit heat dissipation. The power output available from such receivers thus also is limited. Various circuits are known to improve the efficiency of power output circuits so that heat losses are reduced. Additionally, protective circuits have been proposed which, when a predetermined temperature is reached, either of heat sinks or electronic equipment connected thereto, interrupt the signal path, to permit the equipment which is overheating to cool. After the cooling temperature has been reached, the signal path is again established. This arrangement has the disadvantage that the user of the car radio cannot listen to the program during the cooling period; if the program happens to be an announcement, or, for example, a traffic report, news, or a weather forecast, such an interruption can be particularly annoying.

THE INVENTION

It is an object to provide a method and a system to permit cooling of excessively heating power output stage components while still permitting reproduction of information contained in the audio signal which is being applied to the audio output stage.

Briefly, a push-pull audio output circuit is provided having two amplifier units. The temperature of both the first and second amplifier units is sensed and a high-temperature signal is provided if the operating temperature exceeds a predetermined level. A control means is coupled to one of the amplifiers, responsive to the high-temperature signal, and to control that one amplifier into saturated condition. This reduces the amplitude of audio power delivered to a transducer, such as a loudspeaker, and thus decreases the heating of the amplifiers.

While the power output level is substantially reduced, some information is still being presented and will not be lost to the user of the radio.

In accordance with a preferred feature of the invention, the amplifiers comprise push-pull transistor stages having push-pull connected transistors. The control system controls one of the amplifiers in such a manner that a transistor of the amplifier is placed into saturated condition and, as such, connected to ground or chassis.

The system and the method have the advantage that excessive high housing temperatures are effectively avoided although the maximum power output from the remaining output transistor stages is not reduced. The output stages will continue to operate, albeit with reduced output power.

The system has the additional advantage that it can be easily built requiring only a few additional circuit components, which lend themselves readily to incorporation in existing circuit structures.

BRIEF DESCRIPTION OF THE DRAWING

The single FIGURE is a schematic diagram of a push-pull audio output stage for a car radio receiver in which standard components are shown only schematically.

DETAILED DESCRIPTION

Two push-pull output circuit units 1,2 form a bridge and output stage operating in A/B mode. The output 3,4 of the push-pull amplifiers 1,2 form the output of the bridge and stage. A transducer 6 in the form of a loudspeaker is coupled via a bipolar capacitor 5 to the output terminals 3,4.

The push-pull amplifiers 1,2 can be constructed in a well-known manner and are shown only schematically, as complementary, or quasi-complementary output stages. Such circuits are well known and, thus, the drawing only shows, schematically, the output transistor 7,8 and 9,10. The input terminal to the audio circuit is shown at 11 and the input signal from terminal 11 is applied to a direct input 1a of the push-pull amplifier 1. The output signal from the push-pull amplifier 1 is applied to a voltage divider formed by resistors 12,13. The tap point of the voltage divider is applied to the inverting input 2b of the push-pull amplifier 2. Upon appropriate dimensioning of the resistance values of the voltage divider 12,13, the output 3,4 of the push-pull amplifiers 1,2 will have oppositely phased signals of identical amplitude applied thereto. The phase-appropriate signals can be applied to the pushpull amplifier 2 also in a different manner, for example as is well known via an inverse feedback network coupled to the push-pull amplifiers 1,2.

The signal applied across loudspeaker 6 will have double the amplitude of the output from either one of the amplifiers 1,2 and is applied thereto over the bipolar capacitor 5.

A temperature sensor 14 is thermally coupled to a heat sink shown schematically only as HS. The push-pull output amplifiers 1,2 are likewise coupled to the heat sink HS, shown only schematically and in fragmentary representation since the actual structure is well known. A suitable temperature sensor is a negative temperature coefficient (NTC) or a positive temperature coefficient (PTC) resistor, which has a predetermined current flowing therethrough. A temperature responsive or sensing signal derived from the temperature sensor 14 is applied to a Schmitt trigger 15. The Schmitt trigger 15, forming a threshold circuit, has a threshold level which is so set that when a maximum permissible temperature is sensed by the sensor 14, a "high temperature" signal is derived from trigger 15 which is coupled to a controlled switch 16. The control switch 16 connects junction 17, which is connected to the inverting input 2b of amplifier 2 through a diode 18 and a resistor 19, to a positive terminal 25 of an operating supply source. Upon closing of switch 16, the transistor 10 in the push-pull amplifier 2 will become conductive, independently of the value of the signal applied from the tap point of the voltage divider 12,13. Transistor 10 will be controlled to saturation. A diode 26, connected to the output terminal 4, and in parallel thereto, permits return current flow.

In effect, rendering the transistor 10 conductive clamps the terminal 4 of amplifier 2 to ground or chassis CH; the output stage now operates as a single output stage, rather than in push-pull. The output signal applied to transducer or load 6 will now only have half the amplitude so that the power derived from the system will be only one-quarter of that which would be supplied if the transistor 10 would not be conductive. This reduces the heat losses, while operating at effectively the same efficiency to one-quarter of the prior heat losses.

The entire system, including the heat sink HS is so arranged that, when operating at ¼ power, the heat sink and hence the electronic components will rapidly cool below the critical temperature. To prevent frequent switchover of power output, switch 16 is opened only when the temperature has dropped substantially below the predetermined temperature level. The trigger circuit 15, thus, should have substantial hysteresis, as shown schematically within the block 15. In stereo receivers, the respective stereo channels have separate output stages which are all mounted on a common heat sink HS. The system is readily adapted to control a plurality of channels, and switch 16, controlled by the sensor 14 and trigger 15, can be used to control the respective channels upon sensing excessive temperature of the heat sink, regardless of which channel contributed to the excessive temperature. Junction 20, between switch 16 and resistor 19, is connected over a plurality of coupling resistors 21,22, with serial diodes 23,24, respectively, to such additional channels. One of them may, for example, be the output stage for another side of normal stereo reception. For four-channel reproduction, additional resistance-diode networks can be used, as is well known.

Switch 16 is shown in the drawing in symbolic form; a semiconductor switch, for example a transistor is preferred. To prevent switching clicks, a low-pass filter 15' is desirably connected between the Schmitt trigger 15 and the switch 16. This low-pass filter is shown in broken lines since it is not strictly necessary. The low-pass filter provides for gradual transition between conductive and non-conductive state of a transistor switch 16.

Various changes and modifications may be made within the scope of the inventive concept.

We claim:
1. Temperature controlled push-pull audio output stage, particularly for vehicular radios, having
   means (11) for supplying an audio signal;
   a first audio amplifier (1) having a first input terminal (1a) connected to said audio signal supply means, and a first output terminal (3);
   means (12,13) for supplying said audio signal, phase shifted by 180°;
   a second audio amplifier (2) having a second input terminal (2b) connected to said phase shift signal supplying means, and a second output terminal (4);
   a reproducing transducer (6) connected between said first and second output terminals (3,4)
   and comprising, in accordance with the invention
   means (14) for sensing, and being responsive to the operating temperature of said first and second amplifiers and providing a high-temperature signal if the operating temperature exceeds a predetermined level;
   and control means (25,16,19,18,17) coupled to one (2) of said amplifiers, and being responsive to said high-temperature signal for controlling said one amplifier into saturated condition to reduce the amplitude of audio power delivered to said transducer and thereby decrease the heating of said amplifiers.

2. Audio output stage as claimed in claim 1, wherein each of the amplifiers (1,2) comprises a push-pull transistor stage having push-pull connected transitors (7,9;8,10) connected between a source of supply (25) and ground or chassis (CH); and
   wherein said control means (25,16,19,18,17) for controlling said one amplifier is connected to control one of the transistors (10) of said one amplifier into saturated condition.

3. Audio output stage as claimed in claim 2, wherein said one transistor is connected to ground or chassis, and, when controlled to be in saturated condition, grounds the 180° phase-shifted audio signal.

4. Audio output stage as claimed in claim 2, further comprising
   a circulating diode (26) coupled between ground and the output (4) of said one of the amplifiers to which the control circuit is connected and polarized to block current flow when said one amplifier is operating in signal amplification mode, but permitting passage of current flow upon response of the temperature sensing means and control of said one of the transistors (10) of the amplifier (2) into saturated condition.

5. Audio output stage as claimed in claim 1, further including a threshold circuit (15) coupled to said temperature sensing means (14) and having a switching level to determine said predetermined level;
   and wherein the control means comprises a source of electrical voltage, and a control switch (16), said control switch being connected to and controlled by said threshold circuit (15) and an output coupled to said one (2) of said amplifiers.

6. Audio output stage as claimed in claim 5, wherein the control switch comprises an electronic switch;
   and a low-pass filter (15') is provided, coupled between the threshold circuit (15) and the transistor switch.

7. Audio output stage as claimed in claim 5, wherein the threshold switch (15) comprises a Schmitt trigger.

8. Audio output stage as claimed in claim 5, wherein the control means further includes a diode (18) connected between the input (2b) of said one amplifier and the controlled switch, said diode being polarized to block when the switch is in open, or non-conductive condition.

9. Audio output stage as claimed in claim 8, further including a coupling resistor (19) serially connected with the diode.

10. Audio output stage as claimed in claim 8, wherein the audio output stage is a multi-channel output stage, and wherein each of the channels of the output stage have, respectively, first and second amplifiers (1,2);
    and further including a plurality of diodes (23,24) having one terminal connected to said control switch and another terminal connected to respective input terminals (2b) of said one amplifier of respective additional channels.

11. Audio output stage as claimed in claim 10, further including coupling resistors (21,22) serially connected with said additional diodes.

12. Audio output stage as claimed in claim 1, wherein the means for supplying said audio signal phase-shifted by 180° to the second audio amplifier comprises circuit means (12,13) coupled to the first output terminal (3) of the first audio amplifier (1) and connecting said signal, 180° out of phase, to the input (2b) of the second audio amplifier (2);

and wherein said control means controls the second one of said amplifiers (2).

13. Audio output stage as claimed in claim 1, further including a heat sink structure (HS), said first and second audio amplifiers, and said temperature sensing means being thermally coupled to said heat sink structure.

14. Audio output stage as claimed in claim 1, wherein said audio output stage comprises a bridge-type output stage;

and wherein said control means is coupled to one of the branches (2) of the bridge for controlling said one bridge branch to operate in saturated condition.

15. Method of controlling the output temperature of a push-pull audio output stage, particularly for vehicular radios, said push-pull output stage having means (11) for supplying an audio signal;

a first audio amplifier stage (1) having a first input terminal (1a) connected to said audio signal supply means, and a first output terminal (3);

means (12,13) for supplying said audio signal, phase-shifted by 180°;

a second audio amplifier stage (2) having a second input terminal (2b) connected to said phase shift supplying means, and a second output terminal (4);

a reproducing transducer (6) connected between said first and second output terminals (3, 4);

and comprising, in accordance with the invention, the steps of sensing operating temperature of said amplifier stages and providing a "high-temperature" signal if the operating temperature exceeds a predetermined level;

and grounding the signal applied to one of said amplifier stages by controlling into saturation a transistor (10) of said one of said stages.

* * * * *